US010459048B2

United States Patent
Kobayashi et al.

(10) Patent No.: US 10,459,048 B2
(45) Date of Patent: Oct. 29, 2019

(54) MAGNETIC RESONANCE IMAGING APPARATUS AND GRADIENT COIL

(71) Applicant: Toshiba Medical Systems Corporation, Otawara-Shi (JP)

(72) Inventors: Tetsuya Kobayashi, Otawara (JP); Masatoshi Yamashita, Utsunomiya (JP); Yoshitomo Sakakura, Nasushiobara (JP); Hiromitsu Takamori, Otawara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 600 days.

(21) Appl. No.: 14/606,350

(22) Filed: Jan. 27, 2015

(65) Prior Publication Data

US 2015/0226818 A1    Aug. 13, 2015

(30) Foreign Application Priority Data

Feb. 10, 2014  (JP) .................................. 2014-023692

(51) Int. Cl.
    *G01V 3/00*    (2006.01)
    *G01R 33/385*    (2006.01)
(52) U.S. Cl.
    CPC ................. *G01R 33/3858* (2013.01)
(58) Field of Classification Search
    CPC .. A61B 5/055; G01R 33/385; G01R 33/3415; G01R 33/543; G01R 33/34
    USPC .......................................................... 324/322
    See application file for complete search history.

(56) References Cited

U.S. PATENT DOCUMENTS

| 5,487,676 A * | 1/1996 | Maruyama | F02P 3/02 324/399 |
| 2001/0019085 A1* | 9/2001 | Okajima | F02D 41/20 239/585.1 |
| 2005/0207609 A1* | 9/2005 | Oser | A47C 7/72 381/396 |
| 2006/0073740 A1* | 4/2006 | Schuster | H01R 4/34 439/807 |
| 2008/0310167 A1* | 12/2008 | Zaderej | F21V 19/0015 362/294 |
| 2009/0261831 A1 | 10/2009 | Harter et al. | |
| 2011/0121832 A1* | 5/2011 | Shvartsman | G01R 33/385 324/318 |

(Continued)

FOREIGN PATENT DOCUMENTS

| JP | 10-201734 A | 8/1998 |
| JP | 2009-201980 A | 9/2009 |

(Continued)

OTHER PUBLICATIONS

Japanese Office Action dated Nov. 28, 2017 in Patent Application No. 2014-023692.

*Primary Examiner* — Walter L Lindsay, Jr.

(74) *Attorney, Agent, or Firm* — Oblon, McClelland, Maier & Neustadt, L.L.P.

(57) ABSTRACT

A magnetic resonance imaging apparatus according to an embodiment includes a gradient coil configured to generate a gradient magnetic field in an image taking space. The gradient coil includes: a first coil member formed by using a first metal that is non-magnetic; and a second coil member connected to the first coil member and formed by using a second metal that is different from the first metal and is non-magnetic.

14 Claims, 5 Drawing Sheets

(56) References Cited

U.S. PATENT DOCUMENTS

2011/0199173 A1\* 8/2011 Leijssen ............ A61N 1/37229
  336/65
2016/0047870 A1  2/2016 Ham

FOREIGN PATENT DOCUMENTS

| JP | 2016-518897 A | 6/2016 |
| WO | WO 2014/162233 A2 | 10/2014 |
| WO | WO 2014/162233 A3 | 10/2014 |

\* cited by examiner

MAGNETIC RESONANCE IMAGING APPARATUS AND GRADIENT COIL

CROSS-REFERENCE TO RELATED APPLICATIONS

This application is based upon and claims the benefit of priority from Japanese Patent Application No. 2014-023692, filed on Feb. 10, 2014; the entire contents of which are incorporated herein by reference.

FIELD

Embodiments described herein relate generally to a magnetic resonance imaging apparatus and a gradient coil.

BACKGROUND

Conventionally, a magnetic resonance imaging apparatus includes a gradient coil configured to generate gradient magnetic fields in an image taking space in which a subject serving as an image taking target is placed. Generally speaking, such a gradient coil includes conductor patterns formed by using copper, as conductive members that form the coil.

DETAILED DESCRIPTION

A Magnetic Resonance Imaging (MRI) apparatus according to an embodiment includes a gradient coil configured to generate a gradient magnetic field in an image taking space. The gradient coil includes: a first coil member formed by using a first metal that is non-magnetic; and a second coil member connected to the first coil member and formed by using a second metal that is different from the first metal and is non-magnetic.

Exemplary embodiments of an MRI apparatus and a gradient coil of the present disclosure will be explained below, with reference to the accompanying drawings.

Figure 1:
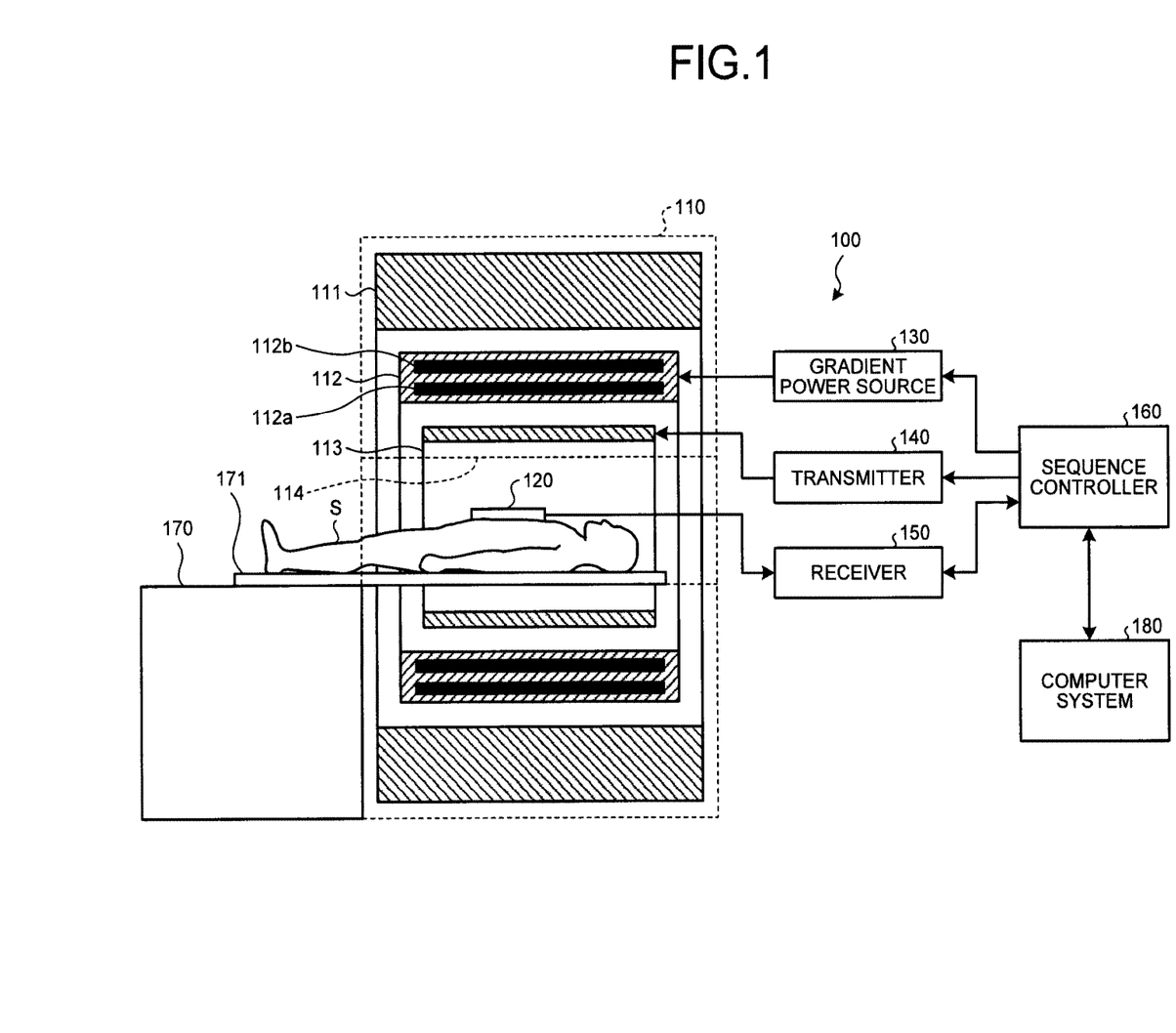
FIG. 1 a block diagram of an exemplary configuration of a Magnetic Resonance Imaging (MRI) apparatus according to an embodiment.

FIG. 1 is a diagram of an exemplary configuration of an MRI apparatus according to an embodiment. As illustrated in FIG. 1, an MRI apparatus 100 includes a gantry 110, a reception coil 120, a gradient power source 130, a transmitter 140, a receiver 150, a sequence controller 160, a couch 170, and a computer system 180.

The gantry 110 is configured to support a magnetostatic field magnet 111, a gradient coil 112, and a transmission coil 113 that are each formed in the shape of a substantially circular cylinder, in such a manner that the central axes thereof are aligned while the gradient coil 112 is disposed on the inner circumferential side of the magnetostatic field magnet 111, whereas the transmission coil 113 is disposed on the inner circumferential side of the gradient coil 112. Further, the gantry 110 has a bore 114 that is formed in the shape of a circular cylinder and positioned on the inner circumferential side of the transmission coil 113. An image taking space is formed on the inner circumferential side of the bore 114.

The magnetostatic field magnet 111 is a magnet formed in the shape of a circular cylinder and is configured to generate a magnetostatic field in the image taking space, by using electric current supplied from a magnetostatic field power source (not illustrated). For example, the magnetostatic field magnet 111 may be a superconducting magnet including a vacuum container formed in the shape of a substantially circular cylinder and a superconducting coil immersed in a cooling liquid within the vacuum container. The magnetostatic field magnet 111 does not necessarily have to be a superconducting magnet and may be a permanent magnet or a normal-conducting magnet.

The gradient coil 112 is a coil formed in the shape of a circular cylinder and is configured to generate, inside the image taking space, gradient magnetic fields of which the intensities change along the X-, Y-, and Z-axes that are orthogonal to one another, by using an electric current supplied from the gradient power source 130. For example, the gradient coil 112 may be an Actively Shielded Gradient Coil (ASGC) including a main coil 112a and a shield coil 112b. The main coil 112a is configured to generate, inside the image taking space, the gradient magnetic fields of which the intensities change along the X-, Y-, and Z-axes. Further, the shield coil 112b is disposed on the outer circumferential side of the main coil 112a and is configured to cancel a leakage magnetic field of the main coil 112a. The gradient coil 112 does not necessarily have to be configured with an ASGC and may not include the shield coil 112b.

The transmission coil 113 is a coil formed in the shape of a circular cylinder and is disposed on the inside of the gradient coil 112. Further, the transmission coil 113 is configured to generate, inside the image taking space, a radio frequency magnetic field, by using a radio frequency current supplied from the transmitter 140.

The reception coil 120 is attached to a subject S and is configured to receive magnetic resonance signals generated from the subject S placed in the image taking space, due to an influence of the radio frequency magnetic field generated by the transmission coil 113. Further, the reception coil 120 is configured to amplify and output the received magnetic resonance signals, by using an amplifier provided therein.

In the present embodiment, the example is explained in which the transmission coil 113 and the reception coil 120 are separate coils. However, it is also acceptable to use a coil that has both the transmitting and the receiving functions and operates for transmitting/receiving purposes. In that situation, the transmission coil 113 may further have the receiving function or the reception coil 120 may further have the transmitting function.

The gradient power source 130 is configured, on the basis of an instruction from the sequence controller 160, to supply the electric current to the gradient coil 112. For example, the gradient power source 130 includes a high voltage generating circuit, a gradient amplifier, and the like. The high voltage generating circuit is configured to convert an alternate current (AC) supplied from a commercial alternate current power source into a direct current (DC) having a predetermined voltage and to supply the DC to the gradient amplifier. The gradient amplifier is configured to amplify the DC supplied from the high voltage generating circuit and to supply the amplified DC to the gradient coil 112.

The transmitter 140 is configured, on the basis of an instruction from the sequence controller 160, to transmit an RF pulse to the transmission coil 113. For example, the transmitter 140 includes, an oscillator, a phase selector, a frequency converter, an amplitude modulator, an RF amplifier, and the like. The oscillator is configured to generate the RF pulse on a resonance frequency that is unique to a targeted atom nucleus in the magnetostatic field. The phase selector is configured to select a phase of the RF pulse generated by the oscillator. The frequency converter is configured to convert the frequency of the RF pulse output from the phase selector. The amplitude modulator is configured to modulate the amplitude of the RF pulse output from the frequency modulator according to, for example, a sinc function. The RF amplifier is configured to amplify the RF pulse output from the amplitude modulator and to supply the amplified RF pulse to the transmission coil 113.

The receiver 150 is configured to detect the magnetic resonance signals received by the reception coil 120, on the basis of an instruction from the sequence controller 160. Further, the receiver 150 is configured to generate raw data by applying an analog-to-digital conversion to the detected magnetic resonance signals and to transmit the generated raw data to the sequence controller 160. For example, the receiver 150 includes a selector, a preamplifier, a phase detector, an A/D converter, and the like. The selector is configured to selectively receive inputs of the magnetic resonance signals output from the transmission coil 113. The preamplifier is configured to amplify the magnetic resonance signals output from the selector. The phase detector is configured to detect the phase of the magnetic resonance signals output from the preamplifier. The A/D converter is configured to convert the signals output from the phase detector into digital signals.

The sequence controller 160 is configured, under the control of the computer system 180, to perform a data acquisition process by driving the gradient power source 130, the transmitter 140, and the receiver 150. Further, when the raw data is transmitted thereto from the receiver 150 as a result of the data acquisition process, the sequence controller 160 transmits the raw data to the computer system 180.

The couch 170 includes a couchtop 171 on which the subject S is placed and is configured to move the couchtop 171 in up-and-down directions, front-and-back directions, and left-and-right directions. In this situation, the front direction is the direction from the couch 170 side toward the gantry 110 side along the axial direction of the magnetostatic field magnet 111. The back direction is the direction from the gantry 110 side toward the couch 170 side along the axial direction of the magnetostatic field magnet 111. The left direction is the direction from the axis of the magnetostatic field magnet 111 toward the left when the gantry 110 is viewed straight on, from the couch 170 side. The right direction is the direction from the axis of the magnetostatic field magnet 111 toward the right when the gantry 110 is viewed straight on, from the couch 170 side. For example, the couch 170 is configured to move the couchtop 171 on which the subject S is placed, into the image taking space formed on the inner circumferential side of the bore of the gantry 110, when an image taking process is to be performed on the subject S.

The computer system 180 is configured to control the entirety of the MRI apparatus 100. For example, the computer system 180 includes: an input device configured to receive various types of inputs from an operator; a sequence control processor configured to cause the sequence controller 160 to perform the data acquisition process on the basis of an image taking condition input by the operator; an image reconstruction processor configured to reconstruct an image on the basis of the raw data transmitted from the sequence controller 160; a storage configured to store therein the reconstructed image, and the like; a display configured to display various types of information including the reconstructed image; and a main control processor configured to control operations of various functional units on the basis of an instruction from the operator.

The exemplary configuration of the MRI apparatus 100 according to the present embodiment has thus been explained. In the MRI apparatus 100 configured as described above, the gradient coil 112 includes the first coil member formed by using the first metal that is non-magnetic; and the second coil member connected to the first coil member and formed by using the second metal that is different from the first metal and is non-magnetic.

For example, in the present embodiment, an example will be explained in which the first metal is aluminum, whereas the second metal is copper. In other words, in the present embodiment, the gradient coil 112 includes: the first coil member formed by using aluminum; and the second coil member connected to the first coil member and formed by using copper.

Generally speaking, in MRI apparatuses, electrically-conductive coil members such as conductor patterns and terminals included in the gradient coil are formed by using copper, which has a high electrical conductivity. In contrast, in the MRI apparatus 100 according to the present embodiment, the gradient coil 112 is formed by using a combination of aluminum and copper. Thus, according to the present embodiment, it is possible to realize the gradient coil 112 that is more lightweight than when all of the electrically-conductive coil members included in a gradient coil are formed by using copper.

In the present embodiment, an example will be explained in which the first coil member is a conductor pattern that forms the coil, whereas the second coil member is a terminal that has connected thereto a power supply cable configured to supply the electric current flowing in the conductor pattern.

Figure 2:
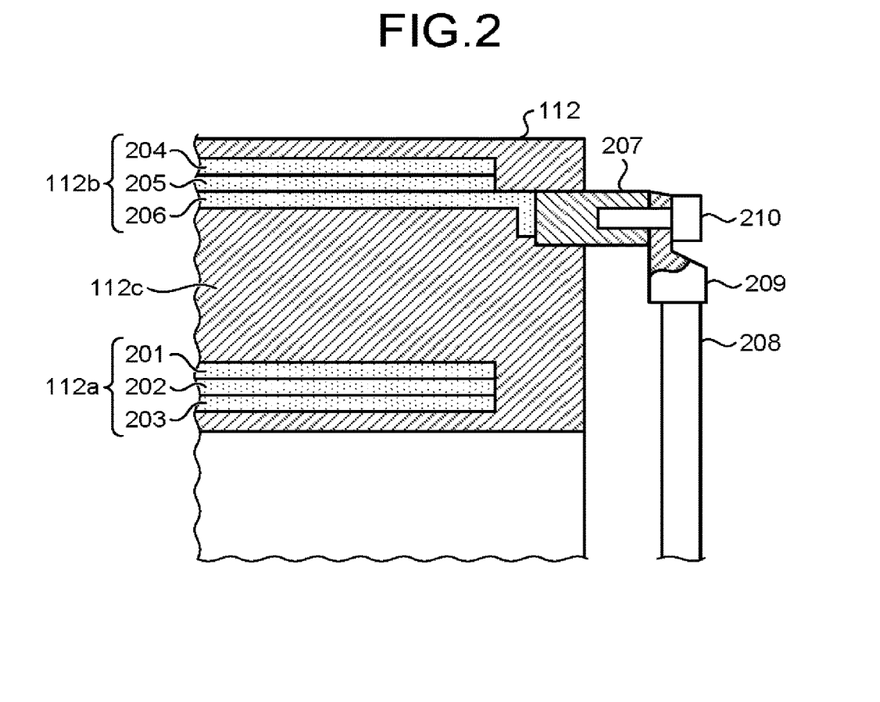
FIG. 2 is a schematic drawing of a connection part of a conductor pattern and a terminal in a gradient coil according to the present embodiment.

FIG. 2 is a schematic drawing of a connection part of a conductor pattern and a terminal in the gradient coil 112 according to the present embodiment. For example, as illustrated in FIG. 2, the gradient coil 112 includes three layers of conductor patterns 201 to 203 that form the main coil 112a and three layers of conductor patterns 204 to 206 that form the shield coil 112b. In this situation, the gradient coil 112 is formed by impregnating the space in the surroundings of the conductor patterns 201 to 203 and the conductor patterns 204 to 206 with resin 112c.

Further, the gradient coil 112 includes a terminal 207 connected to the conductor pattern 206 included in the shield coil 112b. The terminal 207 has connected thereto a power supply cable 208 configured to supply the electric current flowing in the conductor pattern 206. For example, to the terminal 207, a terminal 209 provided on the power supply cable 208 side is attached, by using a bolt 210. In this situation, the power supply cable 208 is provided between the gradient power source 130 and the gradient coil 112 and is configured to supply the electric current from the gradient power source 130 to the gradient coil 112. Further, although not illustrated in FIG. 2, a terminal similar to the terminal 207 is connected to each of the conductor patterns 201 to 205.

Further, each of the conductor patterns 201 to 206 is formed by using aluminum. In contrast, the terminal connected to each of the conductor patterns 201 to 206 is formed by using copper.

Generally speaking, in MRI apparatuses, conductor patterns and terminals of a gradient coil are formed by using copper, which has a high electrical conductivity. For this reason, for example, as a method for realizing a lightweight gradient coil, it is possible to form the conductor patterns and the terminals by using aluminum, which is more lightweight than copper. However, because the power supply cable connected to the gradient coil is placed in the magnetostatic field, the power supply cable vibrates due to a Lorentz force acting thereon while an electric current is flowing therethrough. Thus, there is a possibility that the terminals may be loosened by the vibration. Accordingly, it is desirable to form the terminals by using copper, which has a higher strength than aluminum.

In this regard, in the present embodiment, the conductor patterns included in the gradient coil 112 are formed by using aluminum, whereas the terminals connected to the conductor patterns are formed by using copper. Thus, according to the present embodiment, while ensuring the strength of the connection parts of the conductor patterns and the terminals, it is possible to realize the gradient coil 112 that is more lightweight than when both the conductor patterns and the terminals are formed by using copper. Further, for example, when the price of copper is higher than the price of aluminum as observed in recent years, it is possible to reduce the cost of the gradient coil 112.

Further, it is predicted that an electrolytic corrosion might occur in the connection part of the conductor pattern 206 and the terminal 207, if copper and aluminum, which are mutually-different types of metals, were simply brought into contact with each other. To cope with this situation, in the present embodiment, the connection part of the conductor pattern 206 and the terminal 207 is connected by solder, after plating of either tin or nickel is applied to the connection surface of the conductor pattern 206 connected to the terminal 207.

Further, it is predicted that a mechanical load might be caused in the connection part of the conductor pattern 206 and the terminal 207, due to the vibration of the power supply cable and/or the vibration of the gradient coil 112 itself caused by the Lorentz force. To cope with this situation, in the present embodiment, the connection part of the conductor pattern 206 and the terminal 207 is fastened by one or more screws. The number of screws used for fastening the connection part of the conductor pattern 206 and the terminal 207 may be one; however, it is desirable to use a plurality of screws in order to reduce the mechanical load caused in the sections fastened by the screws. For this reason, in the present embodiment, the connection part of the conductor pattern 206 and the terminal 207 is fastened by the plurality of screws.

The connection part of the conductor pattern 206 and the terminal 207 according to the present embodiment will be explained below further in detail. Although the connection part of the conductor pattern 206 and the terminal 207 will be explained as an example below, the other conductor patterns and the other terminals are also connected in the same manner as the conductor pattern 206 and the terminal 207 are connected together.

Figure 3:
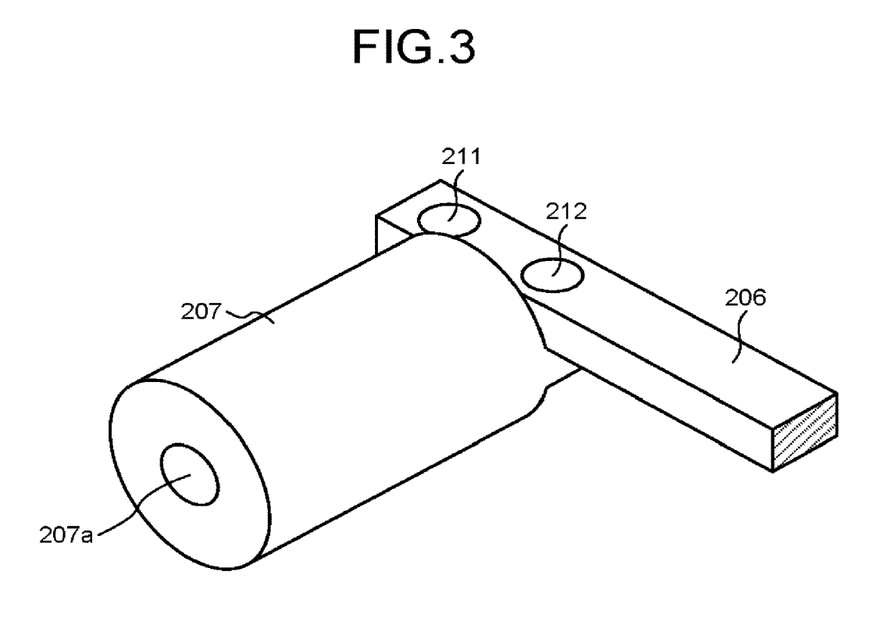
FIG. 3 is a perspective view of an external appearance of the connection part of the conductor pattern and the terminal according to the present embodiment.

FIG. 3 is a perspective view of an external appearance of the connection part of the conductor pattern 206 and the terminal 207 according to the present embodiment. For example, as illustrated in FIG. 3, the terminal 207 is formed in the shape of a substantially circular column. On one end of the terminal 207, a hole 207a is formed so that a bolt 210 used for attaching the terminal 209 provided on the power supply cable 208 side can be fitted therein. To the other end, an end of the conductor pattern 206 is attached.

Further, as illustrated in FIG. 3, for example, the connection part of the conductor pattern 206 and the terminal 207 is fastened by two screws 211 and 212. In the present embodiment, the example will be explained in which the connection part of the conductor pattern 206 and the terminal 207 is fastened by the two screws; however, the connection part may be fastened by three or more screws.

Figure 4:
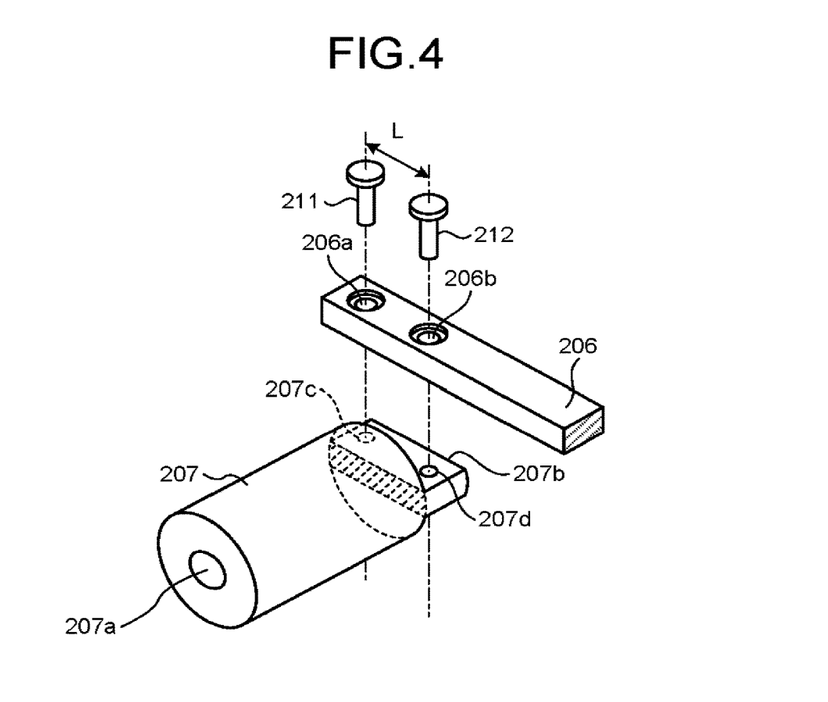
FIG. 4 is a perspective view of a structure of the connection part of the conductor pattern and the terminal according to the present embodiment.

FIG. 4 is a perspective view of a structure of the connection part of the conductor pattern 206 and the terminal 207 according to the present embodiment. For example, as illustrated in FIG. 4, on the one end of the terminal 207 positioned on the side where the conductor pattern 206 is attached, an attachment part 207b is formed in the shape of a plate that projects from the end face of the circular cylindrical shape. In this situation, two screw holes 207c and 207d are formed in the attachment part 207b, at an interval of a length L. Further, on the one end of the conductor pattern 206 positioned on the side attached to the terminal 207, two through holes 206a and 206b are formed at an interval of the length L.

Further, the screw 211 goes through the through hole 206a formed in the conductor pattern 206 and is fitted into the screw hole 207c formed in the attachment part 207b. Further, the screw 212 goes through the through hole 206b formed in the conductor pattern 206 and is fitted into the screw hole 207d formed in the attachment part 207b. As explained here, as a result of the screw 211 being fitted into the screw hole 207c and the screw 212 being fitted into the screw hole 207d, the conductor pattern 206 and the terminal 207 are fastened together.

By fastening the connection part of the conductor pattern 206 and the terminal 207 by using the plurality of screws in this manner, it is possible to reduce the load caused in the connection part. As a result, it is possible to fasten the conductor pattern 206 and the terminal 207 together more firmly.

For example, the material of which the screws 211 and 212 are made may be either copper or brass. By using the screws made of either copper or brass, it is possible to keep the electrical resistance small at the connection part of the conductor pattern 206 and the terminal 207.

Figure 5:
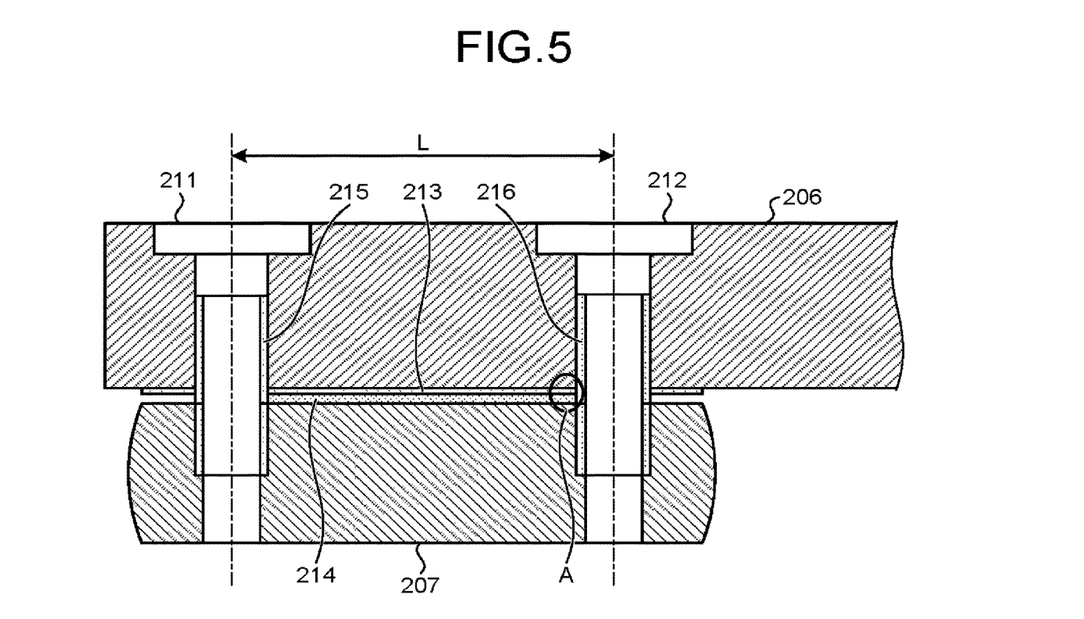
FIG. 5 is a cross-sectional view of the connection part of the conductor pattern and the terminal according to the present embodiment.

FIG. 5 is a cross-sectional view of the connection part of the conductor pattern 206 and the terminal 207 according to the present embodiment. For example, as illustrated in FIG. 5, to the connection surface of the conductor pattern 206 connected to the terminal 207, plating 213 of either tin or nickel is applied. Further, the connection part of the conductor pattern 206 and the terminal 207 is connected by solder 214.

By applying the plating 213 to the connection surface of the conductor pattern 206 connected to the terminal 207 in this manner, it is possible to prevent an electrolytic corrosion that may occur at the connection part from developing.

Further, by connecting the conductor pattern 206 and the terminal 207 together by the solder 214, it is possible to keep the electrical resistance small at the connection part. In the present situation, the example is explained in which the plating 213 is applied to the connection surface on the conductor pattern 206 side; however, plating may further be applied to the connection surface of the terminal 207 connected to the conductor pattern 206.

In addition, for example, plating 215 of either tin or nickel is also applied to the surface of the male screw thread formed on the screw 211. Similarly, plating 216 is also applied to the surface of the male screw thread formed on the screw 212. In the present situation, the example is explained in which the plating is applied to the surfaces of the male screw threads; however, for example, plating may be applied to the surfaces of the female screw threads formed in the attachment part 207b of the terminal 207. Further, if female screw threads are also formed in the conductor pattern 206, plating may be applied to the surfaces of the female screw threads formed in the conductor pattern 206. In these situations, the plating may be applied to both the surfaces of the male screw threads and the surfaces of the female screw threads. Alternatively, the plating may be applied to the surfaces of only one selected from between the male screw threads and the female screw threads.

With respect to the screws used for fastening the conductor pattern 206 and the terminal 207 together, by applying the plating to the surfaces of at least one selected from between the male screw threads and the female screw threads in this manner, it is possible to prevent the electrolytic corrosion that may occur at the male screw threads and the female screw threads from developing.

Further, for example, the plurality of screws used for fastening the connection part of the conductor pattern 206 and the terminal 207 are positioned at the interval that keeps the load on the solder 214 equal to or smaller than a predetermined magnitude. In this situation, to reduce the mechanical load on the solder 214, it is desirable to arrange the interval L between the screw 211 and the screw 212 to be as large as possible.

However, if the interval L was arranged to be too large, a shear strain might occur at the solder 214 due to the difference in linear expansion coefficients between copper and aluminum, and the solder 214 might break. For this reason, in the present embodiment, the interval at which the plurality of screws are positioned is arranged to be such a length that keeps the magnitude of a shear stress equal to or smaller than a predetermined value, the shear stress being applied to the solder 214 by the shear strain occurring at the connection surface due to the difference in the linear expansion coefficients between the conductor pattern 206 and the terminal 207.

Figure 6:
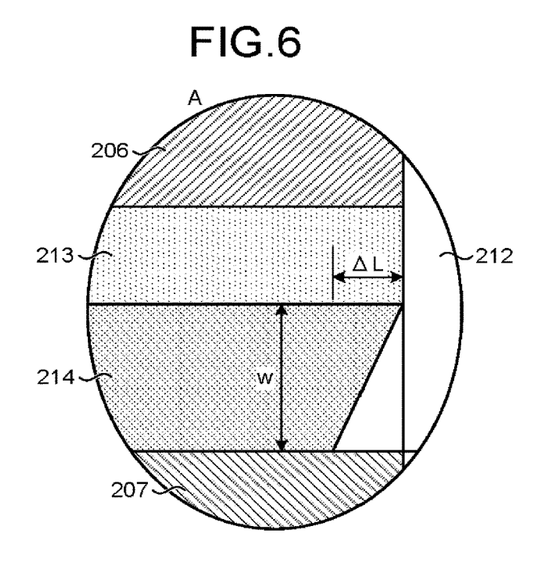
FIG. 6 is an enlarged view of the connection part of the conductor pattern and the terminal illustrated in FIG. 5.

FIG. 6 is an enlarged view of the connection part of the conductor pattern 206 and the terminal 207 illustrated in FIG. 5. FIG. 6 is an enlarged view of part A indicated in FIG. 5. It is generally known that copper and aluminum have mutually-different linear expansion coefficients. For this reason, if the temperature of the connection part of the conductor pattern 206 and the terminal 207 rises, the conductor pattern 206 and the terminal 207 expand with heat by mutually-different amounts. As a result, a shear force is generated by the connection surface of the conductor pattern 206 and the connection surface of the terminal 207, and a shear strain occurs at the solder 214 that is positioned between the conductor pattern 206 and the terminal 207. For example, as illustrated in FIG. 6, a difference ΔL in length occurs along the surface direction, between the surface of the solder 214 on the conductor pattern 206 side and the surface of the solder 214 on the terminal 207 side.

Figure 7:
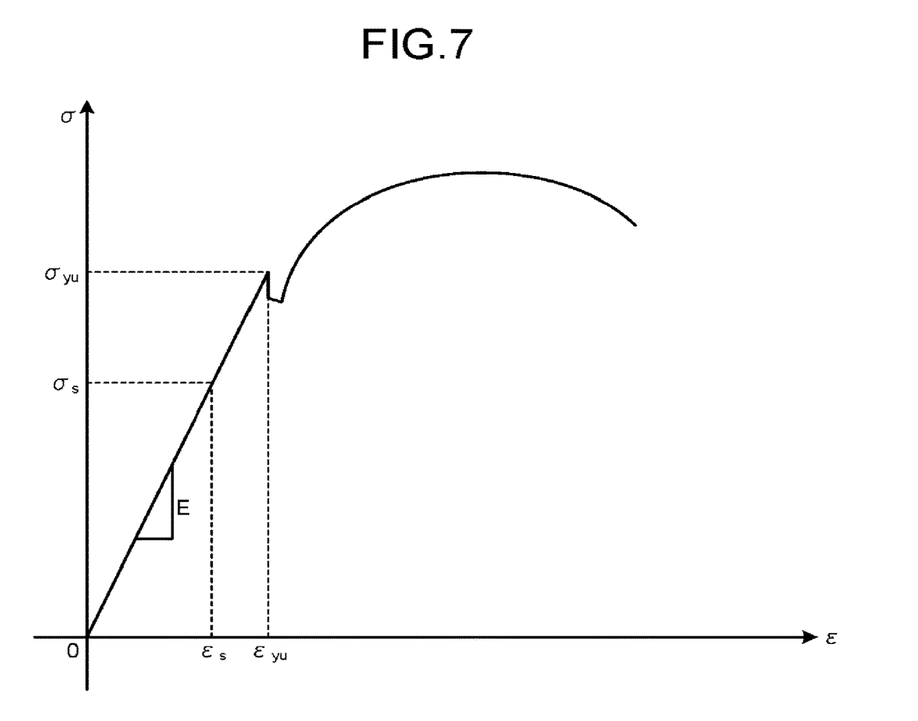
FIG. 7 is a chart of a stress-strain curve of solder according to the present embodiment.

FIG. 7 is a chart of a stress-strain curve of the solder 214 according to the present embodiment. For example, let us assume that the stress-strain curve of the solder 214 has been obtained as illustrated in FIG. 7, by performing a tensile test or the like. In FIG. 7, the vertical axis expresses a stress σ occurring at the solder 214, whereas the horizontal axis expresses a strain ε occurring at the solder 214. Further, $\sigma_{yu}$ denotes an upper yield point, whereas $\varepsilon_{yu}$ denotes the strain at the upper yield point $\sigma_{yu}$, and E denotes the Young's modulus. Further, $\sigma_s$ denotes an allowable stress calculated on the basis of the upper yield point $\sigma_{yu}$ and a predetermined safety factor, whereas $\varepsilon_s$ denotes the strain corresponding to the allowable stress $\sigma_s$. Alternatively, the allowable stress $\sigma_s$ may be calculated on the basis of a tensile strength of the solder 214 and a safety factor.

When such a stress-strain curve has been obtained, for example, the interval L between the screw 211 and the screw 212 is set on the basis of Expression (1) presented below. In Expression (1), $\alpha_{Cu}$ is a linear expansion coefficient of copper, whereas $\alpha_{Al}$ is a linear expansion coefficient of aluminum. Further, w denotes the thickness of the solder 214, whereas G is a modulus of transverse elasticity. Further, ΔT denotes an increase in the temperature at the connection part, whereas $\tau_s$ denotes an allowable shear stress that is roughly calculated on the basis of the allowable stress $\sigma_s$.

$$L = \frac{\tau_s}{G} \cdot \frac{w}{(\alpha_{Al} - \alpha_{Cu})\Delta T} \quad (1)$$

By setting the interval L between the screw 211 and the screw 212 in such a manner that the magnitude of the shear stress applied to the solder 214 is equal to or smaller than the predetermined value in this manner, it is possible to prevent the solder 214 from being broken by the shear force acting on the solder 214. As a result, it is possible to connect the conductor pattern 206 and the terminal 207 together more firmly, while preventing the electrolytic corrosion from developing.

Further, it is generally known that an electrolytic corrosion on a conductive member made of copper or aluminum develops when the conductive member is in contact with air, due to the moisture in the air. For this reason, in the present embodiment, the connection part of the conductor pattern 206 and the terminal 207 is enclosed in resin.

Figure 8:
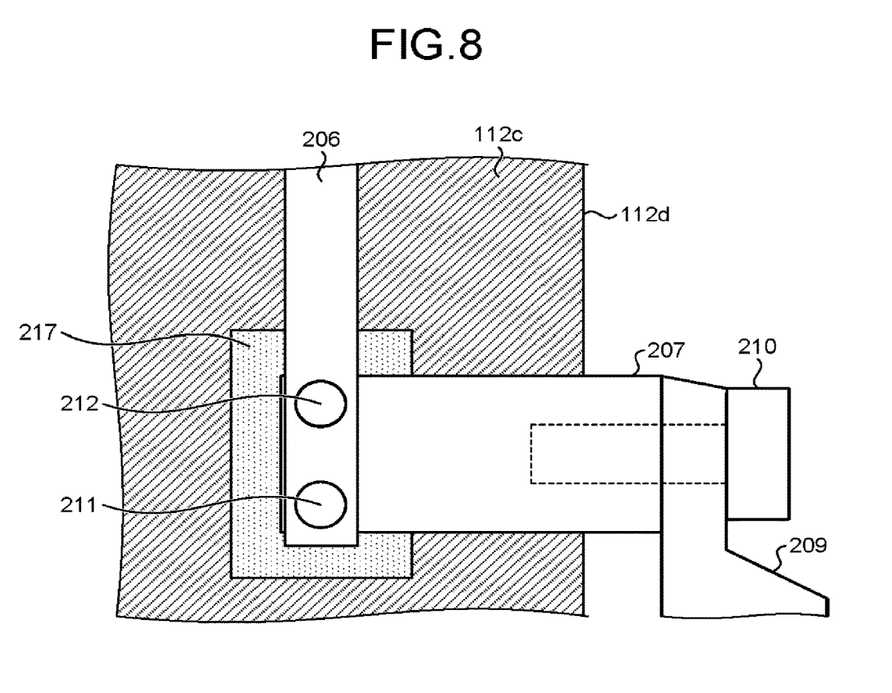
FIG. 8 is a drawing of surroundings of the connection part of the conductor pattern and the terminal in the gradient coil according to the present embodiment.

FIG. 8 is a drawing of surroundings of the connection part of the conductor pattern 206 and the terminal 207 in the gradient coil 112 according to the present embodiment. For example, as illustrated in FIG. 8, the connection part of the conductor pattern 206 and the terminal 207 is enclosed in the resin 112c with which the space in the surroundings of the conductor pattern 206 is impregnated. As a result, the connection part of the conductor pattern 206 and the terminal 207 is enclosed in the resin 112c integrally formed with the conductor pattern 206. By arranging the connection part of the conductor pattern 206 and the terminal 207 to be enclosed in the resin in this manner, it is possible to prevent the electrolytic corrosion occurring at the connection part from developing.

Further, for example, the connection part of the conductor pattern 206 and the terminal 207 is positioned between an end face 112d of the gradient coil 112 and the conductor pattern 206. In that situation, for example, the terminal 207 is arranged in such a manner that at least a part thereof is disposed outside the gradient coil 112. For example, as illustrated in FIG. 8, the terminal 207 is provided in such a manner that the end thereof positioned on the side where the terminal 209 provided on the power supply cable 208 side is attached protrudes from the end face 112d of the gradient coil 112.

Further, for example, the connection part of the conductor pattern 206 and the terminal 207 is covered by a barrier layer. For example, as illustrated in FIG. 8, the connection part of the conductor pattern 206 and the terminal 207 is covered by a barrier layer 217 configured with grass fibers wound around the connection part. By arranging the connection part of the conductor pattern 206 and the terminal 207 to be covered by the barrier layer 217 in this manner, even if the resin 112c in the surroundings of the connection part cracks or comes off, it is possible to block the air that may otherwise enter the surroundings of the connection part. With this arrangement, even if the resin 112c in the surroundings of the connection part of the conductor pattern 206 and the terminal 207 cracks or comes off, it is possible to prevent the electrolytic corrosion occurring at the connection part from developing, and it is therefore possible to prevent an electrical disconnection from occurring on the inside of the resin 112c. The material of which the barrier layer 217 is made does not necessarily have to be glass fibers. Any other material may be used.

As explained above, in the MRI apparatus 100 according to the present embodiment, the gradient coil 112 is configured in such a manner that the conductor patterns structuring the coil are formed by using aluminum, whereas the terminals having connected thereto the power supply cables used for supplying the electric currents flowing in the conductor patterns are formed by using copper. Consequently, according to the present embodiment, it is possible to realize the gradient coil 112 that is more lightweight than when both the conductor patterns and the terminals are formed by using copper.

Further, according to the present embodiment, by applying the plating to the connection part of the conductor pattern 206 and the terminal 207 and enclosing the connection part in the resin, it is possible to prevent the electrolytic corrosion occurring at the connection part from developing. As a result, it is possible to keep the connection part of the conductor pattern 206 and the terminal 207 in a stable state on a long-term basis.

In the embodiment described above, the example is explained in which, in the connection part of the conductor pattern 206 and the terminal 207, the plating is applied to the connection surface of the conductor pattern 206 connected to the terminal 207; however, possible embodiments are not limited to this example.

For instance, it is acceptable to apply an electrically-conductive compound (grease) to the connection surface of the conductor pattern 206 connected to the terminal 207. With this arrangement, it is possible to prevent the electrolytic corrosion occurring at the connection part from developing, similarly to the example in which the plating is applied.

Further, in the embodiment described above, the example is explained in which the mechanical load caused by the vibration of the power supply cables due to the Lorentz force is reduced by forming the terminals having connected thereto the power supply cables by using copper, which has a higher strength than aluminum; however, possible embodiments are not limited to this example.

For instance, in the embodiment described above, in the power supply cables, copper is used as a conductive member. Alternatively, for example, in the power supply cables, aluminum may be used as a conductive member. Because aluminum is more lightweight than copper, by using the power supply cables in which aluminum is used as a conductive member, it is possible to reduce the mechanical load caused by the Lorentz force.

Further, a coaxial cable may be used as any of the power supply cables. Further, a coaxial pipe that uses a pipe made of either copper or aluminum as an external conductive member may be used as any of the power supply cables. When such a coaxial pipe is used, the pipe used as the external conductive member may be more rigid than cables using electric wires. With this arrangement, it is possible to reduce the mechanical load caused by the Lorentz force.

Further, in the embodiment described above, the example is explained in which the terminal 207 connected to the conductor patter 206 of the shield coil 112b and the terminal 209 of the power supply cable 208 side are connected by using the bolt 210; however, possible embodiments are not limited to this example.

For instance, the terminal 207 and the terminal 209 may be configured by using parts that maintain the connection state by interdigitating with each other. For example, the terminal 207 and the terminal 209 may be configured by using parts called one-touch joint or one-touch coupler. With this arrangement, it is possible to prevent loosening, which may occur when a bolt is used for connecting.

Further, in the embodiment described above, the example is explained in which the first metal is aluminum, whereas the second metal is copper; however, possible embodiments are not limited to this example.

For instance, instead of aluminum and copper, either non-magnetic stainless steel (e.g., SUS 316, SUS 304, etc.), gold, silver, platinum, tungsten, brass (alloy of copper and zinc) and the like may be used as either one of the first and the second metal. For example, the conductor patterns may be formed by using aluminum, whereas the terminals may be formed by using stainless steel, gold, silver, platinum, tungsten, or brass. Further, for example, the conductor patterns may be formed by using one selected from among aluminum, stainless steel, gold, silver, platinum, tungsten, and brass, whereas the terminals may be formed by using a metal that is selected from among copper, stainless steel, gold, silver, platinum, tungsten, and brass and that is different from the metal used for forming the conductor patterns.

Further, in the embodiment described above, the example is explained in which the conductor pattern and the terminal are formed by using the mutually-different metals; however, possible embodiments are not limited to this example.

For instance, it is acceptable to form a plurality of sections included in a single conductor pattern by using mutually-different metals. For example, a first section included in the single conductor pattern may be considered as the first coil member, whereas a second section included in the single conductor pattern may be considered as the second coil member. Further, for example, if the first coil member generates heat more frequently than the second coil member, the first metal used for forming the first coil member may be such a metal that has a higher heat resistance than the second metal used for forming the second coil member. For example, because a central section of the gradient coil 112 is considered to generate heat more frequently than a peripheral section of the gradient coil 112, the conductor pattern in the peripheral section may be formed by using aluminum, whereas the conductor pattern in the central section may be formed by using copper, which has a higher heat resistance than aluminum.

Further, for example, when the gradient coil 112 is configured by combining three coils corresponding to the X-, the Y-, and the Z-axes that are orthogonal to one another, the conductor patterns in the three coils may be formed by using mutually-different metals. For example, the coil corresponding to the X-axis, which is often assigned to a read-out direction, is known to generate heat more frequently than the coil corresponding to the Y-axis and the coil corresponding to the Z-axis. For this reason, for example, as the metal forming the conductor pattern in the coil corresponding to the X-axis, a metal having a higher heat resistance than the metal forming the conductor patterns in the coils corresponding to the Y-axis and the Z-axis may be used. For example, the conductor patterns in the coils corresponding to the Y-axis and the Z-axis may be formed by using aluminum, whereas the conductor pattern in the coil corresponding to the X-axis may be formed by using copper, which has a higher heat resistance than aluminum.

Further, as explained above, when the gradient coil 112 is an ASGC including a main coil and a shield coil, the conductor pattern in the main coil and the conductor pattern in the shield coil may be formed by using mutually-different metals. For example, because the main coil has a larger number of windings in the conductor pattern than the shield coil does and because the main coil is positioned closer to the center of the magnetic field, the main coil is known to generate more heat than the shield coil does. For this reason, as the metal forming the conductor pattern in the main coil, a metal having a higher heat resistance than that of the conductor pattern in the shield coil may be used. For example, the conductor pattern in the shield coil may be formed by using aluminum, whereas the conductor pattern in the main coil may be formed by using copper, which has a higher heat resistance than aluminum.

In the embodiment described above, the gradient coil 112 includes the first coil member formed by using the first metal that is non-magnetic; and the second coil member connected to the first coil member and formed by using the second metal that is different from the first metal and is non-magnetic. In other words, according to the embodiment described above, the gradient coil 112 is formed by using the plurality of mutually-different metals. By forming the gradient coil 112 by using the plurality of mutually-different metals, it is possible to flexibly address various types of requirements for the gradient coil 112.

For example, by forming one or more of the plurality of coil members included in the gradient coil 112 by using aluminum, it is possible to arrange the gradient coil 112 to be more lightweight than when all the coil members are formed by using copper. Further, for example, by forming one or more of the plurality of coil members included in the gradient coil 112 by using a metal that is less expensive than the one or more metals used for forming the other coil members, it is possible to lower the cost of the gradient coil 112. Further, for example, by forming one or more of the plurality of coil members that are included in the gradient coil 112 and that generate more heat than those in the other sections of the gradient coil 112, while using a metal that has a higher heat resistance than the one or more metals used for forming the other coil members, it is possible to enhance durability of the gradient coil 112.

In other words, if all the coil members in the gradient coil 112 were formed by using mutually the same kind of metal, disadvantage characteristics of the metal might exhibit in one or more of the coil members in a concentrated manner. To cope with this situation, according to the embodiment described above, by forming one or more of the coil members while using a type of metal that is different from the one or more metals used for forming the other coil members, it is possible to complement the disadvantageous characteristics of the one or more metals used for forming the other coil members. As a result, it is possible to reduce or solve the problems that may be caused when all the coil members in the gradient coil 112 are formed by using mutually the same type of metal.

According to at least one aspect of the embodiments described above, it is possible to flexibly address the requirements for the gradient coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a gradient coil configured to generate a gradient magnetic field in an image taking space,
wherein
the gradient coil includes:
a first coil member formed by using a first metal that is non-magnetic; and
a second coil member connected to the first coil member and formed by using a second metal that is different from the first metal and is non-magnetic, wherein
the first coil member is a conductor pattern that forms a coil, and
the second coil member is a terminal that has connected thereto a power supply cable configured to supply an electric current flowing in the conductor pattern,
wherein the first coil member is connected to the second coil member by solder at a connection surface that is a part of a surface of the first coil member, the connection surface being connected to the second member after being plated with either tin or nickel.

2. A gradient coil comprising:
a first coil member formed by using a first metal that is non-magnetic; and
a second coil member connected to the first coil member and formed by using a second metal that is different from the first metal and is non-magnetic, wherein
the first coil member is a conductor pattern that forms a coil, and
the second coil member is a terminal that has connected thereto a power supply cable configured to supply an electric current flowing in the conductor pattern,
wherein the first coil member is connected to the second coil member by solder at a connection surface that is a part of a surface of the first coil member, the connection surface being connected to the second member after being plated with either tin or nickel.

3. The magnetic resonance imaging apparatus according to claim 1, wherein
the first metal is aluminum, and
the second metal is copper.

4. The magnetic resonance imaging apparatus according to claim 1, wherein a connection part of the first coil member and the second coil member is fastened by a screw.

5. The magnetic resonance imaging apparatus according to claim 4, wherein the connection part of the first coil member and the second coil member is fastened by a plurality of screws.

6. The magnetic resonance imaging apparatus according to claim 5, wherein the plurality of screws are positioned at an interval that keeps a load on the solder equal to or smaller than a predetermined magnitude.

7. The magnetic resonance imaging apparatus according to claim 6, wherein the interval at which the plurality of screws are positioned is arranged to be such a length that keeps a magnitude of a shear stress equal to or smaller than a predetermined value, the shear stress being applied to the solder by a shear strain occurring at the connection surface due to a difference in linear expansion coefficients between the first coil member and the second coil member.

8. The magnetic resonance imaging apparatus according to claim 4, wherein a material of which each of the one or more screws is made is either copper or brass.

9. The magnetic resonance imaging apparatus according to claim 4, wherein plating of either tin or nickel is applied to a surface of at least one selected from the following: a male screw thread formed on the screw; a female screw thread formed in the first coil member; and a female screw thread formed in the second coil member.

10. The magnetic resonance imaging apparatus according to claim 1, wherein a connection part of the first coil member and the second coil member is enclosed in resin.

11. The magnetic resonance imaging apparatus according to claim 10, wherein
the gradient coil is formed by impregnating a space in surroundings of the first coil member with resin, and
the connection part of the first coil member and the second coil member is enclosed in the resin with which the space in the surroundings of the first coil member is impregnated.

12. The magnetic resonance imaging apparatus according to claim 11, wherein the connection part of the first coil member and the second coil member is positioned between an end face of the gradient coil and the first coil member.

13. The magnetic resonance imaging apparatus according to claim 11, wherein the second coil member is arranged in such a manner that at least a part thereof is disposed outside the gradient coil.

14. The magnetic resonance imaging apparatus according to claim 11, wherein the connection part of the first coil member and the second coil member is covered by a barrier layer.

* * * * *